US009991390B2

(12) United States Patent
George et al.

(10) Patent No.: US 9,991,390 B2
(45) Date of Patent: Jun. 5, 2018

(54) THIN FILM TRANSITION METAL DICHALCOGENIDES AND METHODS

(71) Applicant: The Regents of the University of California, Oakland, CA (US)

(72) Inventors: Aaron S. George, Los Angeles, CA (US); Robert Ionescu, Sunnyvale, CA (US); Hamed Hosseini Bay, Arlington, MA (US); Mihrimah Ozkan, San Diego, CA (US); Cengiz S Ozkan, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days. days.

(21) Appl. No.: 14/871,277

(22) Filed: Sep. 30, 2015

(65) Prior Publication Data

US 2016/0093689 A1 Mar. 31, 2016

Related U.S. Application Data

(60) Provisional application No. 62/057,520, filed on Sep. 30, 2014.

(51) Int. Cl.
*H01L 21/02* (2006.01)
*H01L 29/78* (2006.01)
(Continued)

(52) U.S. Cl.
CPC .. *H01L 29/78681* (2013.01); *H01L 21/02381* (2013.01); *H01L 21/02485* (2013.01); *H01L 21/02488* (2013.01); *H01L 21/02499* (2013.01); *H01L 21/02516* (2013.01); *H01L 21/02568* (2013.01); *H01L 21/02628* (2013.01); *H01L 21/02664* (2013.01); *H01L 21/02694* (2013.01); *H01L 29/66742* (2013.01); *H01L 29/66969* (2013.01); *B82Y 30/00* (2013.01); *C23C 16/305* (2013.01); *C30B 29/46* (2013.01)

(58) Field of Classification Search
CPC ...... H01L 33/00–33/648; H01L 31/00–31/208
See application file for complete search history.

(56) References Cited

U.S. PATENT DOCUMENTS 9,147,824 B1 * 9/2015 Cao ................... H01L 21/02485
2004/0208439 A1 * 10/2004 Bell ......................... G02B 6/43
385/32

(Continued)

OTHER PUBLICATIONS

Ki, Wooseok, et al. "Highly conductive group VI transition metal dichalcogenide films by solution-processed deposition." Journal of materials research 22.05 (2007): 1390-1395.*

(Continued)

*Primary Examiner* — Victor A Mandala
*Assistant Examiner* — Regan J Rundio
(74) *Attorney, Agent, or Firm* — Schwegman Lundberg & Woessner, P.A.

(57) ABSTRACT

A coated substrate including a thin film of a transition metal dichalcogenide and associated methods are shown. In one example, the substrate is a semiconductor wafer. In one example, the thin film is atomically thin, and the substrate is a number of centimeters in diameter. In one example a crystalline structure of the thin film is substantially 2H hexagonal.

5 Claims, 6 Drawing Sheets

(51) Int. Cl.

| | |
|---|---|
| H01L 29/786 | (2006.01) |
| H01L 29/10 | (2006.01) |
| H01L 29/66 | (2006.01) |
| C30B 29/46 | (2006.01) |
| B82Y 30/00 | (2011.01) |
| C23C 16/30 | (2006.01) |

(56) References Cited

U.S. PATENT DOCUMENTS

| | | | | |
|---|---|---|---|---|
| 2008/0283873 | A1* | 11/2008 | Yang | H01L 21/76898 257/211 |
| 2014/0197459 | A1* | 7/2014 | Kis | H01L 29/66742 257/194 |
| 2014/0245946 | A1* | 9/2014 | Kong | C30B 25/186 117/95 |
| 2014/0251204 | A1* | 9/2014 | Najmaei | C30B 25/04 117/95 |
| 2014/0353166 | A1* | 12/2014 | Iezzi | B01J 37/0238 205/638 |
| 2015/0064471 | A1* | 3/2015 | Dresselhaus | C23C 14/12 428/408 |
| 2015/0083206 | A1* | 3/2015 | Novoselov | B82Y 30/00 136/256 |
| 2016/0020352 | A1* | 1/2016 | Konstantatos | H01L 31/0352 257/24 |
| 2016/0093491 | A1* | 3/2016 | Choi | H01L 21/02485 438/151 |
| 2016/0168694 | A1* | 6/2016 | Min | C23C 16/305 423/561.1 |
| 2016/0181516 | A1* | 6/2016 | Reed | H01L 45/06 365/163 |

OTHER PUBLICATIONS

Gu, Xing, et al. "A Solution-processed hole extraction layer made from ultrathin MoS2 nanosheets for efficient organic solar cells." Advanced Energy Materials 3.10 (2013): 1262-1268.*

Liu, Keng-Ku, et al. "Growth of large-area and highly crystalline MoS2 thin layers on insulating substrates." Nano letters 12.3 (2012): 1538-1544.*

George, Aaron S., et al. "Wafer scale synthesis and high resolution structural characterization of atomically thin MoS2 layers." Advanced Functional Materials 24.47 (2014): 7461-7466.*

Yun, Jin-Mun, et al. "Efficient work-function engineering of solution-processed MoS 2 thin-films for novel hole and electron transport layers leading to high-performance polymer solar cells." Journal of Materials Chemistry C 1.24 (2013): 3777-3783.*

Pütz, Jörg, and Michel A. Aegerter. "MoS x thin films by thermolysis of a single-source precursor." Journal of Sol-Gel Science and Technology 19.1 (2000): 821-824.*

Zhan, Yongjie, et al. "Large—area vapor—phase growth and characterization of MoS2 atomic layers on a SiO2 substrate." Small 8.7 (2012): 966-971.*

Liu, Hongfei, et al. "Vapor-phase growth and characterization of Mo 1-x W x S 2 (0≤x≤1) atomic layers on 2-inch sapphire substrates." Nanoscale 6.1 (2014): 624-629.*

Kutana, Alex, Evgeni S. Penev, and Boris I. Yakobson. "Engineering electronic properties of layered transition-metal dichalcogenide compounds through alloying." Nanoscale 6.11 (2014): 5820-5825.*

Dumcenco, Dumitru O., et al. "Visualization and quantification of transition metal atomic mixing in Mo1-xWxS2 single layers." Nature communications 4 (2013): 1351.*

Chen, Yanfeng, et al. "Tunable band gap photoluminescence from atomically thin transition-metal dichalcogenide alloys." Acs Nano 7.5 (2013): 4610-4616.*

Zhang, Jing, et al. "Scalable growth of high-quality polycrystalline MoS2 monolayers on SiO2 with tunable grain sizes." ACS nano 8.6 (2014): 6024-6030.*

George, Aaron Scott. Two-Dimensional Van der Waals Materials for Thin Film Transistor Applications. University of California, Riverside, 2014.*

Mutlu, Zafer, et al. "Synthesis, characterization, and electronic structure of few-layer MoSe2 granular films." physica status solidi (a) 211.12 (2014): 2671-2676.*

Balendhran, Sivacarendran, et al., "Atomically Thin Layers of MoS2 via a Two Step Thermal Evaporation-Exfoliation Method†", Nanoscale, 4, (2012), 461-466.

Berkdemir, Ayse, et al., "Identification of individual and few layers of WS2 using Raman Spectroscopy", Sci. Rep. 3, (2013), 1755.

Bhanu, Udai, et al., "Photoluminescence quenching in gold—MoS2 hybrid nanoflakes", Sci. Rep. 4, (2014), 5575.

Brivio, Jacopo, et al., "Ripples and Layers in Ultrathin MoS2 Membranes", Nano Lett. 11, (2011), 5148-5153.

Coehoorn, R, et al., "Electronic structure of MoSe2, MoS2, and WSe2• I. Band-structure calculations and photoelectron spectroscopy", Phys. Rev. B 35, (1987), 6195-6201.

Coleman, Jonathan N., et al., "Two-Dimensional Nanosheets Produced by Liquid Exfoliation of Layered Materials", Science, 331, (2011), 568-571.

Ge, Wanyin, et al., "Large-scale synthesis of NbS2 nanosheets with controlled orientation on graphene by ambient pressure CVD†", Nanoscale, 5, (2013), 5773-5778.

Guo, Hongyan, et al., "Tuning Electronic and Magnetic Properties of Early Transition—Metal Dichalcogenides via Tensile Strain", J. Phys. Chem. C, 118, (2014), 7242-7249.

Gutiérrez, H. R., et al., "Extraordinary Room-Temperature Photoluminescence in Triangular WS2 Monolayers", ACS nano 7, (2013), 3447-3454.

Ionescu, Robert, et al., "Oxygen etching of thick MoS2 films", Chem. Commun., DOI: 10.1039/c4cc03911d., (2014), 11226-11229.

Ionescu, Robert, et al., "Synthesis of Atomically Thin MoS2 Triangles and Hexagrams and Their Electrical Transport Properties", IEEE Transactions on Nanotechnology, vol. 13, No. 4, (Jul. 2014), 749-754.

Jeffery, Anto A., et al., "Two-Dimensional Nanosheets and Layered Hybrids of MoS2 and WS2 through Exfoliation of Ammoniated MS2 (M=Mo,W)", J. Phys. Chem. C 118, (2014), 1386-1396.

Kim, Sunkook, et al., "High-Mobility and Low-Power Thin-Film Transistors Based on Multilayer Mos2 Crystals", Nat. Commun. 3, (2012), 1011-1017.

Kosmider, K., et al., "Electronic properties of the MoS2-WS2 heterojunction", Phys. Rev. Lett. B 87, (2013), 075451.

Lee, Yi-Hsien, et al., "Synthesis of Large-Area MoS2 Atomic Layers with Chemical Vapor Deposition", Adv. Mater. 24, (2012), 2320-2328.

Li, Bo, et al., "Growth of large area few-layer or monolayer MoS2 from controllable MoO3 nanowire nuclei", RSC Adv. 4, (2014), 26407 pgs.

Li, Hong, et al., "From Bulk to Monolayer MoS 2 : Evolution of Raman Scattering", Adv. Mater. 22, (2012), 1385-1390.

Lin, Yu-Chuan, et al., "Wafer-scale MoS2 thin layers prepared by MoO3 sulfurizatio†", Nanoscale, 4, (2012), 6637-6641.

Liu, et al., "Atomic Layer Deposition of MoS2 film", Nanoscale, DOI:10.1039/C4NR02451F., (2014).

Mann, John, et al., "2-Dimensional Transition Metal Dichalcogenides with Tunable Direct Band Gaps: MoS 2(1-x) Se 2x Monolayers", Adv. Mater., 26, (2014), 1399-1404.

Mouri, et al., "Tunable Photoluminescence of Monolayer MoS2 via Chemical Doping", Nano Lett. 13, (2013), 5944-5948.

Mutlu, Zafer, et al., "Effects of Process Tube Position on Properties of Graphene Layers", MRS Proc., 1451, (2012), 57-62.

Najmaei, Sina, et al., "Vapour Phase Growth and Grain Boundary Structure of Molybdenum Disulphide Atomic Layers", Nat. Mater., 12, (2013), 754-759.

Putz, J, et al., "MoSx Thin Films by Thermolysis of a Single-Source Precursor", J. Sol-Gel Sci. Technoi 19, (2000), 821-824.

Putz, J., et al., "Liquid Film Deposition of Chalcogenide Thin Films", J. Sol-Gel Sci. Technol, 26, 807-811.

Radisavljevic, B., et al., "Single-layer MoS2 Transistors", Nat. Nanotechnol., 6, (2011), 147-151.

(56) References Cited

OTHER PUBLICATIONS

Song, et al., "Layer-Controlled, Wafer-Scale, and Conformal Synthesis of Tungsten Disulfide Nanosheets Using Atomic Layer Deposition", ACS nano 7, (2013), 11333-11340.
Van Der Zande, A. M, et al., "Grains and Grain Boundaries in Highly Crystalline Monolayer Molybdenum Disulphide", Nature Materials vol. 12, (Jun. 2013), 554-561.
Wang, H., et al., "Integrated Circuits Based on Bilayer MoS2 Transistors", Nano Lett., 12,(2012), 4674.
Wang, Qing Hua, et al., "Electronics and Optoelectronics of Two-Dimensional Transition Metal Dichalcogenides", Nat. Nanotechnol. 7, (2012), 699-712.
Wickramaratne, Darshana, et al., "Electronic and Thermoelectric Properties of Few-Layer Transition Metal Dichalcogenides", J. Chem. Phys. 140, (2014), 124710.
Wu, et al., "Determining the thickness of atomically thin MoS2 and WS2 in the TEM", Ultramicroscopy 147, (2014), 8 pgs.
Yoon, Youngki; et al., "How Good Can Monolayer MoS2 Transistors Be?", Nano Lett. 11, (2011), 3768-3773.
Zeng, Zhiyuan, et al., "Single-Layer Semiconducting Nanosheets: High-Yield Preparation Device Fabrication", Angew. Chem. Int. Ed. 50, (2011), 11093-11097.
Zhao, Weijie, et al., "Evolution of Electronic Structure in Atomically Thin Sheets of WS2 and WSe2", ACS nano 7, (2012), 791-797.

\* cited by examiner

THIN FILM TRANSITION METAL DICHALCOGENIDES AND METHODS

CLAIM OF PRIORITY

This application claims the benefit of priority under 35 U.S.C. § 119(e) to U.S. Provisional Patent Application Ser. No. 62/057,520, filed on Sep. 30, 2014, which is incorporated by reference herein in its entirety.

TECHNICAL FIELD

This invention relates to thin film transition metal dichalcogenides and methods. In one example, this invention relates to silicon based anodes for lithium ion batteries.

BACKGROUND

Synthesis of atomically thin $MoS_2$ layers and its derivatives with large-area uniformity is an essential step to exploit the advanced properties of $MoS_2$ for their possible applications in electronic and optoelectronic devices.

Atomically thin two-dimensional (2D) transition-metal dichalcogenide (TMD) materials ($MoS_2$, $WS_2$, $MoSe_2$, $WSe_2$, $NbS_2$, $NbSe_2$, etc.) hold promise for next-generation electronics due to enticing optical and electronic properties. TMD materials exhibit a large variety of electronic behaviors such as metallic, semiconductivity and superconductivity.

DETAILED DESCRIPTION

Figure 1:
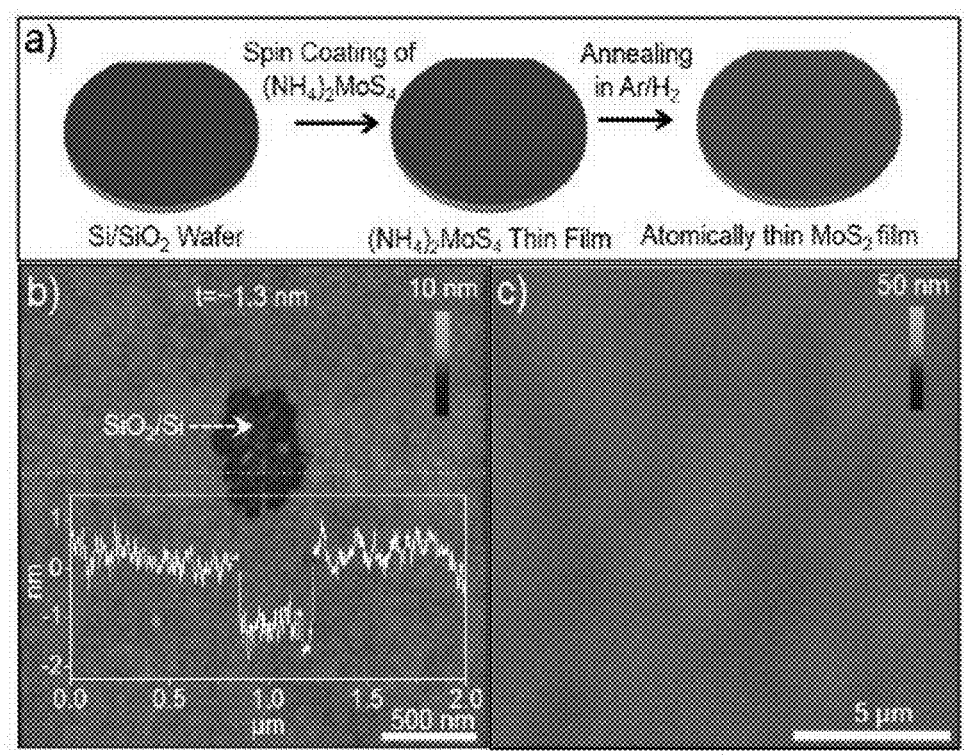
FIG. 1 shows a schematic method and selected micrographs of a coated wafer according to an example of the invention.

In the following detailed description, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, or logical changes, etc. may be made without departing from the scope of the present invention.

Synthesis of atomically thin $MoS_2$ layers and its derivatives with large-area uniformity is an essential step to exploit the advanced properties of $MoS_2$ for their possible applications in electronic and optoelectronic devices. In this work, we have reported on a facile method for the continuous synthesis of atomically thin $MoS_2$ layers at wafer scale through thermolysis of a spin coated-ammonium tetrathiomolybdate film. The thickness and surface morphology of the sheets are characterized by atomic force microscopy. The optical properties are studied by UV-visible absorption, Raman and photoluminescence spectroscopies. The compositional analysis of the layers is done by X-ray photoemission spectroscopy. The atomic structure and morphology of the grains in the polycrystalline $MoS_2$ atomic layers are examined by high-angle annular dark-field scanning transmission electron microscopy. The electron mobilities of the sheets are evaluated using back-gate field-effect transistor configuration. Our results indicate that this facile method is a promising approach to synthesize $MoS_2$ thin films at the wafer scale and can also be applied to synthesis of $WS_2$ and hybrid $MoS_2$—$WS_2$ thin layers.

1. Introduction

Atomically thin two-dimensional (2D) transition-metal dichalcogenide (TMD) materials ($MoS_2$, $WS_2$, $MoSe_2$, $WSe_2$, $NbS_2$, $NbSe_2$, etc.) hold promise for next-generation electronics due to enticing optical and electronic properties. TMD materials exhibit a large variety of electronic behaviors such as metallic, semiconductivity and superconductivity. $MoS_2$, a semiconducting TMD material, possesses an indirect band gap of ~1.3 eV in its bulk form and a direct band gap of ~1.8 eV as a monolayer, allowing its realization in advanced optoelectronic devices. Moreover, large on/off current ratio ($10^8$) and abrupt switching (sub-threshold swing ~70 mV/decade) have been recently reported for monolayer $MoS_2$ transistors, suggesting promise in future electronic devices such as low power applications. In this regard, synthesis of large uniform area atomically thin $MoS_2$ films by a facile and reliable method is an essential requirement for applying these novel electronic and optical properties into future electronic and optoelectronic devices.

Top-down approaches such as micromechanical exfoliation, liquid exfoliation and intercalation assisted exfoliation to obtain large-area $MoS_2$ thin films have received considerable attention. However, lateral dimensions of films from these methods have been reported to be tens of micrometers, which limits their applications for large-area electronics.

Using elemental S and $MoO_3$, some techniques demonstrate the bottom-up growth of centimeter scale highly crystalline $MoS_2$ films via chemical vapor deposition (CVD). Although this approach is promising for future production of $MoS_2$, current production of $MoS_2$ at wafer scale is still in a nascent stage.

Other techniques for synthesis of $MoS_2$ include thermolysis of single precursor containing M and S and sulfurization of $MoO_3$ films. Synthesis of $MoS_2$ films by thermolysis of spin casted-$(NH_4)_2MoS_4$ or alkyldiammonium thiomolybdate has been reported, but with several nanometers in thickness and undesirable carbon residues. More recently, $MoS_2$ films have been synthesized by thermolysis of dip-coated $(NH_4)_2MoS_4$ films on sapphire under sulfur pressure and transferred to $SiO_2$.

We have demonstrated direct synthesis of atomically thin $MoS_2$ sheets on $SiO_2$/Si at wafer scale by thermolysis of spin coated-$(NH_4)_2MoS_4$ films. Spin coating of the films offers excellent control of the film thickness by varying the concentration of solution and spin coating speed. Additionally, thermolysis of the spin coated thin films offers a method to synthesize $MoS_2$ sheets without the use of sulfur and high temperatures.

2. Results and Discussion

2.1. Thickness and Surface Morphology

FIG. 1a schematically illustrates the preparation procedure of atomically thin $MoS_2$ films. Our approach is based on the thermolysis of spin coated-$(NH_4)_2MoS_4$ films to grow $MoS_2$ thin layers on $SiO_2$/Si at wafer scale. Atomic force microscopy (AFM) was used to characterize the surface morphology and thickness of $MoS_2$ thin layers. FIG. 1b shows the AFM image and height profile of the $MoS_2$ film with a dewetted region, which is occasionally observed on the film. The thickness of the film is measured from the edges of the dewetted region. The inset shows that the thickness of the film is ~1.3 nm, a value consistent with the expected thickness from a bilayer $MoS_2$. The surface roughness value, Ra, is determined to be 0.25 nm from the height profile in FIG. 1c.

2.2. Atomic Structure Characterization

Figure 2:
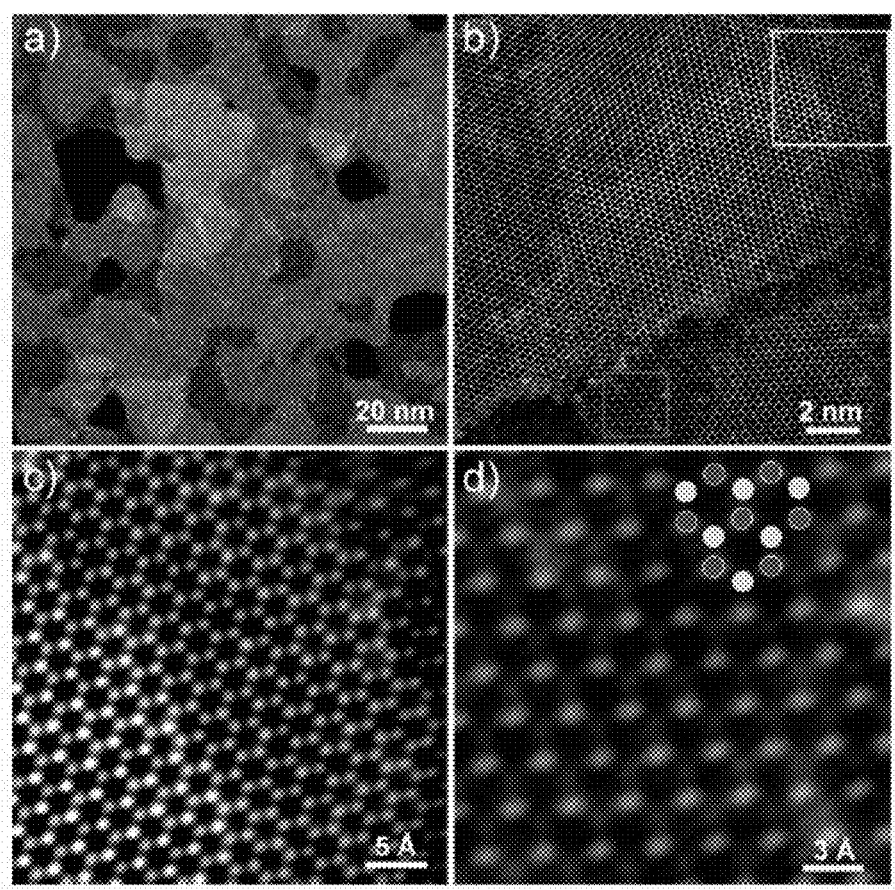
FIG. 2 shows images of a coated substrate according to an example of the invention.
Figure 6:
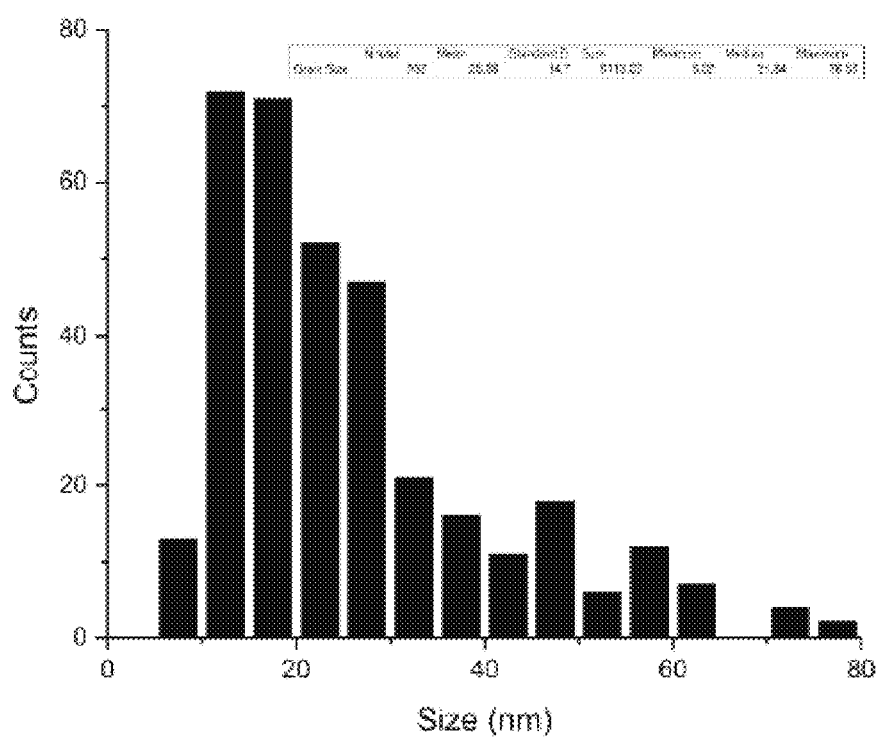
FIG. 6 shows grain size distribution of a coated substrate according to an example of the invention.

High-angle annular dark-field scanning TEM (HAADF-STEM) images of the $MoS_2$ film at different magnifications are shown in FIG. 2. Regions of monolayers as well as double and triple layers can be identified here consistent with AFM and Raman analysis.[21] Thicker regions, containing two or three layers, appear more intense in these images because the higher number of atoms in each atomic column leads to higher scattering of the incident electron beam into ADF detector. FIG. 2c shows the characteristic hexagonal structure of $MoS_2$. Two atomic sites with distinguishable intensities can be identified at each thickness step as a result of the AB stacking of the $MoS_2$ structure, proving that the material is indeed semiconducting 2H polymorph and not metallic 1T. For the monolayer 2H $MoS_2$ (FIG. 2d), the higher intensity atoms are Mo, while lower intensity atoms are S as expected for HAADF-STEM imaging. A detail analysis of the grain/domain sizes of the $MoS_2$ sheets is shown in FIG. 6. Basically, the average grain/domain size in these $MoS_2$ sheets is 25.9+/−14.7 nm.

2.3. Spectroscopic and Optical Properties

Figure 3:
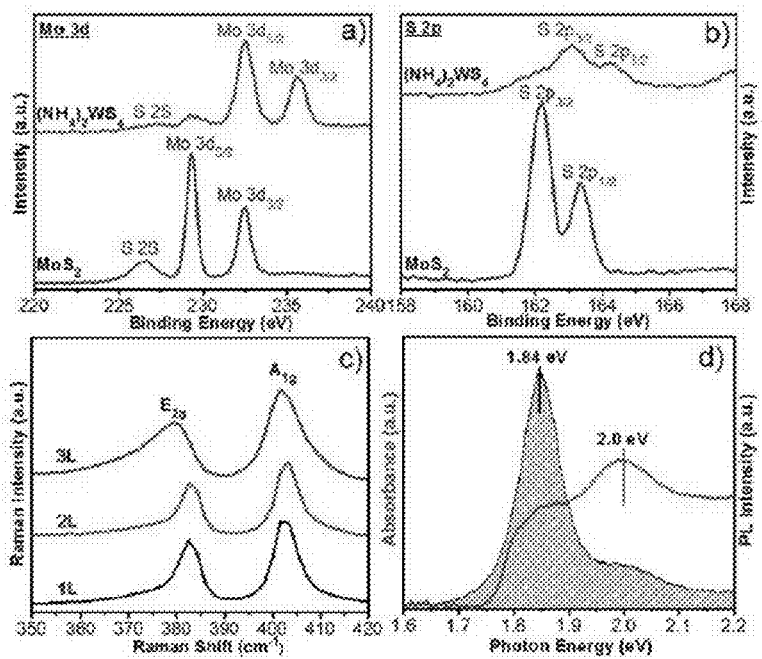
FIG. 3 shows characterization spectra of a coated substrate according to an example of the invention.

X-ray photoemission spectroscopy (XPS) was used to determine the chemical compositions and chemical states of the precursor and obtained films. FIGS. 3a and 3b display XPS data for Mo and S binding energies, respectively, from $MoS_2$ and $(NH_4)_2MoS_4$ films. The $(NH_4)_2MoS_4$ film exhibits two Mo 3d peaks at 232.2 and 235.5 eV, corresponding to the $3d_{3/2}$ and $3d_{5/2}$ binding energies, respectively, characteristic for the $Mo^{6+}$ state. The $MoS_2$ layer also exhibits two characteristic Mo 3d peaks at 229.3 and 232.5 eV, corresponding to the $3d_{3/2}$ and $3d_{5/2}$ binding energies for the $Mo^{4+}$, respectively. Moreover, a shift in the binding energies of sulfur is also observed. The sulfur peak for the 2s orbital is shifted from 229.2 to 226.6 eV, while $2p_{3/2}$ and $2p_{5/2}$ peaks are shifted from 235.6 to 232.5 eV, and 232.5 to 229.3 eV, respectively, as shown in FIGS. 3a and 3b. Decreases in the binding energy of sulfur can be explained by the change of oxidation state of Mo from $Mo^{6+}$ to $Mo^{4+}$, which causes a decrease in the bond strength between molybdenum and sulfur. The results confirm the change of oxidation state of Mo from $Mo^{6+}$ to $Mo^{4+}$ and the complete transition from $(NH_4)_2MoS_4$ to $MoS_2$.

Raman spectroscopy is a powerful nondestructive characterization tool to reveal the crystallinity and thickness of 2D atomically thin materials such as TMDs and graphene. FIG. 3c shows the Raman spectra taken from the regions with various thicknesses on the $MoS_2$ film at room temperature. The spectrum reveals two characteristic Raman modes of $MoS_2$, $E_{2g}$ and $A_{1g}$. The frequency difference between $E_{2g}$ and $A_{1g}$ phonons has been shown as an indicator of the number of layers in $MoS_2$. We observe the frequency difference of the $E_{2g}$ and $A_{1g}$ peaks to be 19.3 $cm^{-1}$, corresponding to monolayer $MoS_2$. Other areas of the $MoS_2$ film show a red shift of $E_{2g}$ peak and blue shift of $A_{1g}$ peak, causing increasing peak spacing between $E_{2g}$ and $A_{1g}$ modes as the number of layers in the $MoS_2$ thin film increases, indicating the presence of other few-layer regions. The Raman spectra results indicate that 1, 2 and 3 layers can be dominant in different regions of the synthesized film.

To further investigate the quality of $MoS_2$ films, photoluminescence (PL) and absorption spectroscopy measurements were performed at room temperature. The PL spectrum in FIG. 3d reveals an intense peak at 1.84 eV, confirming the presence of the direct band gap in atomically thin $MoS_2$.[28,29] FIG. 3d also shows the absorption spectra of the $MoS_2$ film. The spectra reveals two absorption peaks at 1.84 eV and 2.0 eV, corresponding to the A1 and B1 direct excitonic transitions at the Brillouin zone K point.

2.4. Electrical Properties

Figure 4:
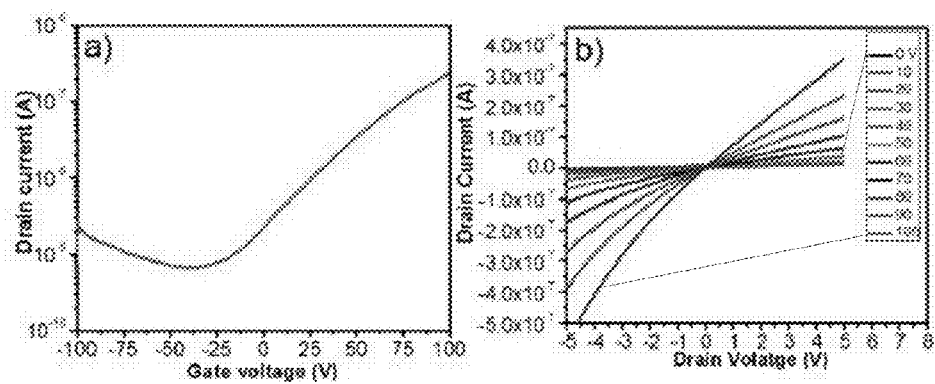
FIG. 4 shows electrical property analysis of a coated substrate according to an example of the invention.

To evaluate the electrical transport properties of the films, the few-layer $MoS_2$ (~1.3 nm) field-effect transistors (FETs) were fabricated on Si/$SiO_2$ substrates with Ti/Au (10/80 nm) contacts. The corresponding transfer and output plots are shown in FIG. 4. The field-effect mobility was extracted using the equation $\mu=(dI_d/dV_g)/(\in V_d W/L_{ox} L)$ (where $L_{ox}$ is the gate dielectric thickness (300 nm), W and L represent channel width and channel length, respectively, $\in$ is the dielectric constant of gate dielectrics (thermal oxide=3.9) and $dI_d/dV_g$ is the slope calculated from FIG. 4a. We found the mobility of $MoS_2$ from this growth method to be ~0.1 $cm^2V^{-1}s^{-1}$, which is in agreement of earlier reports on the characterization of $MoS_2$ layers synthesized by the CVD method. The on/off current ratio is ~108, which may be increased for $V_g$>100 V. The transfer plot shows n-type switching behavior of the synthesized $MoS_2$ thin sheets. The threshold voltage ($V_{th}$) obtained by linear extrapolation method is ~70V. By using the equation $n_{2D}=C_{ox}(V_g-V_{th})$/q (where $C_{ox}$ is the oxide capacitance), the estimated electron concentration is 7.19×10$^{11}$ $cm^{-2}$ at $V_g$=80V and 2.16×10$^{12}$ $cm^{-2}$ at $V_g$=100V.

2.5. Growth of $WS_2$ and Hybrid $MoS_2$—$WS_2$ Thin Layers

Figure 5:
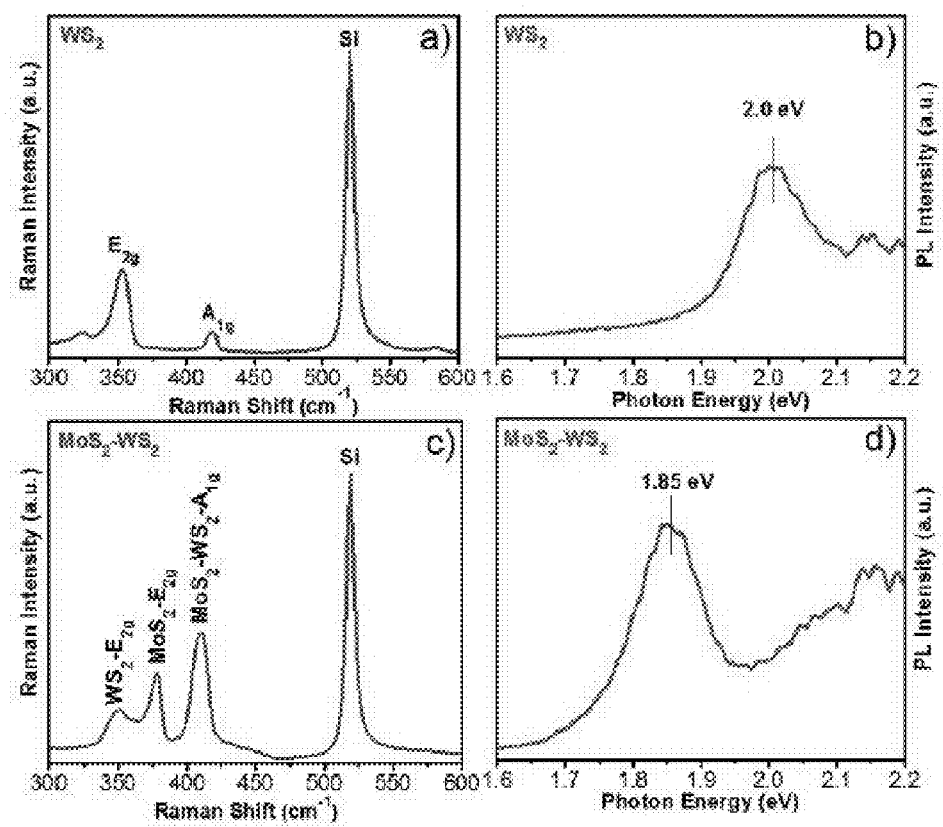
FIG. 5 shows Raman spectra of a coated substrate according to an example of the invention.

To demonstrate the versatility of the method described above, we have performed the synthesis of $WS_2$ from ammonium tetrathiotungstate, $(NH_4)_2WS_4$, in a similar manner to that of $MoS_2$. The Raman spectra reveals two main characteristics peaks, $E_{2g}$ and $A_{1g}$, of $WS_2$, shown by FIG. 5a. PL spectrum shows an excitation centered at 2.0 eV (FIG. 5b). Both Raman and PL spectroscopy results confirm the atomically thin film nature of the grown films by this technique.[34-36] Hybrid $MoS_2$—$WS_2$ materials can be also synthesized with this approach by simply combining precursors $(NH_4)_2MoS_4$ and $(NH_4)_2WS_4$ in solution prior to spin coating, as confirmed by the Raman spectra in FIG. 5c. After thermolysis of the two precursor film, an alloy in the form of $Mo_xW_{2-x}S_2$ can be achieved, where x denotes the proportion of Mo and W in the resulting film. PL of the hybrid $MoS_2$—$WS_2$ film produced by equal amounts of $(NH_4)_2MoS_4$ and $(NH_4)_2WS_4$ shows an excitation at 1.85 eV, consistent with previous reports of $Mo_xW_{2-x}S_2$ films. It is straightforward to envision how this process can be utilized to achieve homogenous alloys and doping of TMDs.

3. Conclusion

In summary, we have demonstrated the synthesis of $MoS_2$ layers by the thermolysis of spin coated thin films on the wafer scale. Furthermore, we have shown that samples may be prepared down to monolayer thickness, as revealed by TEM analysis. Back-gate FET devices are fabricated directly on the Si/SiO$_2$ substrate used for growth and show mobilities of 0.1 cm$^2$V$^{-1}$s$^{-1}$. This approach may be applied to numerous substrates and suggests a promising route towards the production of other TMD materials, alloyed or electronically doped TMD materials. Thin WS$_2$ and hybrid MoS$_2$—WS$_2$ films have been produced successfully with this method, as confirmed by Raman spectroscopy, offering synthesis of TMD materials with tunable bandgap for future electronics applications. This process provides smooth and relatively uniform synthesis by a facile method, which can exclude the use of elemental sulfur, showing promise in atomically thin TMD synthesis for future electronics applications.

4. Experimental Details 4.1. Materials Processing

Herein, atomically thin MoS$_2$ films were synthesized onto 2 inch SiO$_2$/Si wafers by thermolysis of spin coated films (see FIG. 1a). Precursor solutions were prepared by dissolution of (NH$_4$)$_2$MoS$_4$ in n-methylpyrollidone (NMP). Prior to spin coating, wafers were cleaned by sonication in toluene, acetone and isopropanol, sequentially for 45 min each. Next, the substrates were submersed in RCA clean SC-1 (5 parts DI water, 1 part NH$_4$OH, 1 part H$_2$O$_2$) for 15 min. Each step is followed by a DI water rinse.

Immediately, following the cleaning procedure, the precursor films were deposited by spin coating under ambient conditions at 3000 rpm for 1 min. After spin coating deposition, the samples were moved immediately into a CVD furnace and heated to 100° C. under vacuum to remove residual NMP. To complete the thermolysis, samples were annealed under Ar/H$_2$ gas flow (200/400 sccm) at 480° C. for 1 h. Subsequently, samples were annealed at 1000° C. in Ar gas flow to improve crystallinity.

Figure 7:
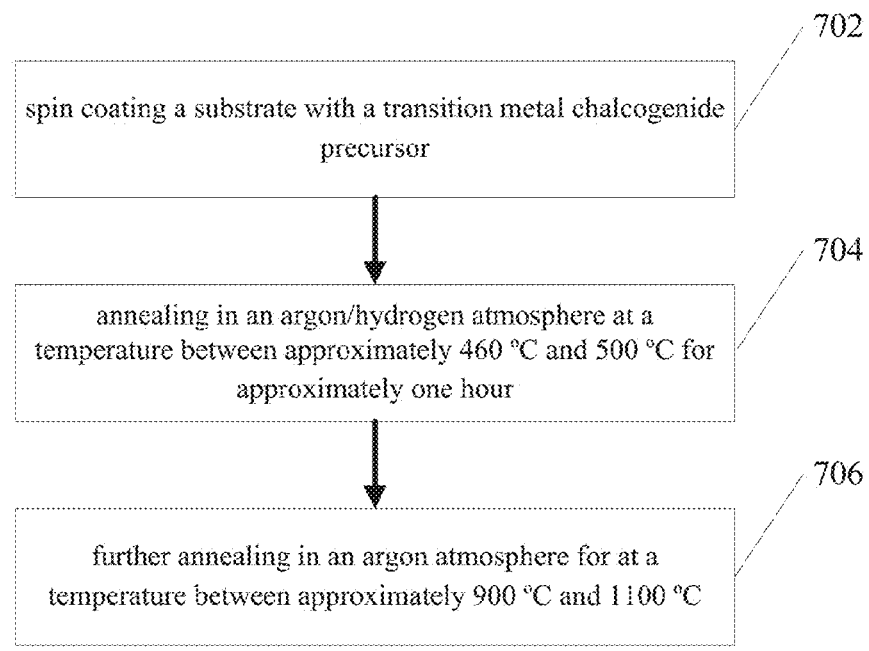
FIG. 7 shows a method of forming a material according to an example of the invention.

FIG. 7 shows a method flow diagram according to an example of the invention. In operation 702, a substrate is spin coated with a transition metal chalcogenide precursor. In operation 704, the substrate is annealed in an argon/hydrogen atmosphere at a temperature between approximately 460° C. and 500° C. for approximately one hour. In operation 706, the substrate is further annealed in an argon atmosphere for at a temperature between approximately 900° C. and 1100° C.

Figure 8:
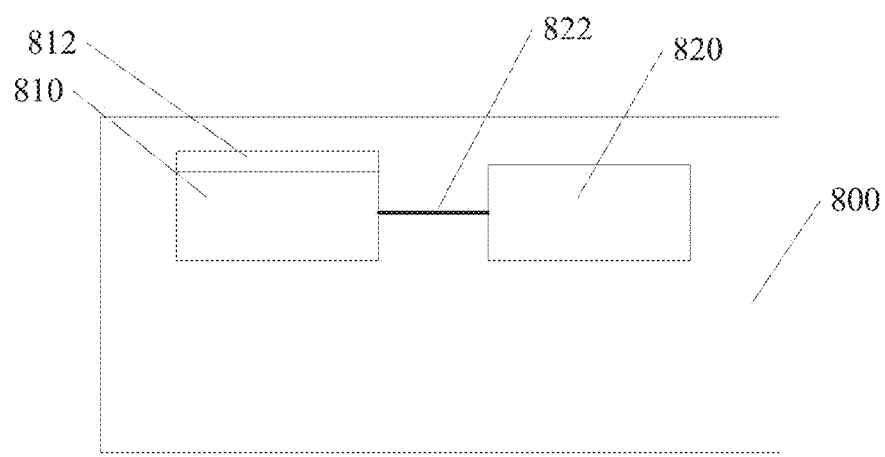
FIG. 8 shows a block diagram of a semiconductor device according to an example of the invention.

FIG. 8 shows a block diagram of a semiconductor device 800. The semiconductor device 800 includes a first circuit 820, and a second circuit 810. In one example, the first and second circuit 820, 810 each include lithographically formed semiconductor devices, such as memory chips, processor chips, etc. In one example at least one of the circuits 820, 810 includes an atomically thin transition metal dichalcogenide layer covering at least a portion of a semiconductor substrate, as described in examples of the present disclosure. In FIG. 8, the second circuit 810 is shown with an atomically thin transition metal dichalcogenide layer 812 covering a portion of a semiconductor substrate, which is a part of the second circuit 810. The first circuit 820 and the second circuit 810 are shown coupled together by wiring 822.

4.2. Materials Characterization

AFM imaging and thickness measurements were performed in tapping mode using a commercial system (Multimode, Veeco). Chemical compositions of the films were determined using a XPS system (Kratos Axis UltraDLD) equipped with an Al Kα monochromatic X-ray source and a 165-mm electron energy hemispherical analyzer. The vacuum pressure was kept below 3×10$^{-9}$ Torr, and a neutralizer was applied during the data acquisition. Raman and PL spectra of the MoS$_2$ films were collected with a Horiba LabRAM HR spectrometer with excitation wavelength of 532 nm and a laser power of ~1 mW. The measurements were performed in a confocal micro configuration using a 100× microscope objective lens. Absorbance measurements were performed using a UV-Vis system (Perkin Elmer, Lambda 35). For transmission electron microscopy (TEM), MoS$_2$ sheets were coated in a protective PMMA layer by spin coating prior to the etching of SiO$_2$ in 45% KOH. Following transfer to lacey carbon TEM grids and drying, PMMA was removed by submersion in acetone. HAADF-STEM imaging was performed on a FEI Titan G$^2$ 60-300 aberration-corrected STEM equipped with a CEOS DCOR probe corrector operated at 200 kV. The MoS$_2$ FETs were fabricated directly on the Si/SiO$_2$ substrate in a backgate FET configuration with Ti/Au (10/80 nm) contacts by using a conventional photolithographic process. DC I-V characteristics were obtained at room temperature using an Agilent 4155C semiconductor parameter analyzer with fabricated probe station.

While a number of advantages of embodiments described herein are listed above, the list is not exhaustive. Other advantages of embodiments described above will be apparent to one of ordinary skill in the art, having read the present disclosure. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An apparatus, comprising:
    a semiconductor wafer; and
    an atomically thin MoS$_2$ layer covering the semiconductor wafer, wherein the MoS$_2$ layer is a 2H crystal structure with an average grain size of 25.9+/−14.7 nm, wherein the MoS$_2$ layer has a band gap of approximately 1.84 eV.

2. The apparatus of claim 1, further including an optoelectronic device formed on the semiconductor wafer.

3. The apparatus of claim 1, wherein the MoS$_2$ layer is two monolayers thick.

4. An electronic device, comprising:
    a first circuit;
    a second circuit coupled to the first circuit, wherein the second circuit includes:
    a semiconductor substrate; and
    an atomically thin MoS$_2$ layer covering at least a portion of the semiconductor substrate, wherein the MoS$_2$ layer is a 2H crystal structure with an average grain size of 25.9+/−14.7 nm, wherein the MoS$_2$ layer has a band gap of approximately 1.84 eV.

5. The electronic device of claim 4, wherein the second circuit includes an optoelectronic device.

* * * * *

UNITED STATES PATENT AND TRADEMARK OFFICE
CERTIFICATE OF CORRECTION

PATENT NO. : 9,991,390 B2  
APPLICATION NO. : 14/871277  
DATED : June 5, 2018  
INVENTOR(S) : George et al.

Page 1 of 1

It is certified that error appears in the above-identified patent and that said Letters Patent is hereby corrected as shown below:

On the Title Page

In item (*), in "Notice", in Column 1, Line 3, delete "days. days." and insert --days.-- therefor On page 2, in Column 2, under "Other Publications", Line 8, delete "a" and insert --A-- therefor On page 2, in Column 2, under "Other Publications", Line 55, delete "sulfurizatio†"," and insert --sulfurization†",-- therefor On page 3, in Column 1, under "Other Publications", Line 23, delete "ofWS2 andWSe2"," and insert --of WS2 and WSe2",-- therefor Signed and Sealed this  
Eleventh Day of June, 2019

Andrei Iancu  
*Director of the United States Patent and Trademark Office*